United States Patent [19]
Nakagawa et al.

[11] Patent Number: 5,393,995
[45] Date of Patent: Feb. 28, 1995

[54] SEMICONDUCTOR THYRISTOR DEVICE WITH RECESS

[75] Inventors: Tsutomu Nakagawa; Futoshi Tokunoh; Kouji Niinobu, all of Fukuoka, Japan

[73] Assignee: Mitsubishi Denki Kabushiki Kaisha, Tokyo, Japan

[21] Appl. No.: 68,162

[22] Filed: May 28, 1993

[30] Foreign Application Priority Data

Jun. 4, 1992 [JP] Japan .................................. 4-143904

[51] Int. Cl.⁶ .......................................... H01L 29/74
[52] U.S. Cl. ................................. 257/147; 257/148; 257/170; 257/490
[58] Field of Search ............... 257/147, 150, 167, 177, 257/148, 170, 503, 490

[56] References Cited

U.S. PATENT DOCUMENTS

| 3,943,548 | 3/1976 | Terasawa | 257/170 X |
| 4,691,224 | 9/1987 | Takada | 257/490 X |
| 4,801,945 | 1/1989 | Iwanishi | 257/490 X |
| 4,881,107 | 11/1989 | Matsushita | 257/338 |

FOREIGN PATENT DOCUMENTS

| 0064613 | 1/1982 | European Pat. Off. | 257/147 |
| 0082419 | 6/1983 | European Pat. Off. | |
| 0143259 | 6/1985 | European Pat. Off. | |
| 0200863 | 12/1986 | European Pat. Off. | |
| 3521079 | 6/1985 | Germany. | |
| 61-232671 | 10/1986 | Japan. | |
| 63-311764 | 12/1988 | Japan. | |

OTHER PUBLICATIONS

Shinohe et al., "Isolation Structure Optimization for High Power Reverse Conductive GTO", 1988 IEEE PESC '88 Record, Apr. 1988, pp. 908–914.
Patent Abstracts of Japan, vol. 11, No. 77 (E-487) (2524), Mar. 7, 1987.
Patent Abstracts of Japan, vol. 13, No. 155 (E-743) (3503), Apr. 14, 1989.

Primary Examiner—William Mintel
Attorney, Agent, or Firm—Oblon, Spivak, McClelland, Maier, & Neustadt

[57] ABSTRACT

There is disclosed a semiconductor device wherein a p layer (7) is formed in an isolating portion (Z) and portions (1a, 1b) of an n-type base layer (1) lie on opposite sides of the p layer (7), the upper surfaces of the p layer (7) and the portions (1a, 1b) lying in the same plane as the upper surface of a p layer (3). The presence of the p layer (7) provides for high resistance to breakdown and high formation accuracy of the p layers (2, 3, 7) as compared with a structure in which the isolating portion (Z) lies in the bottom of a the recess, whereby the semiconductor device is less susceptible to short-circuit between the p-type base layer (2) and the p layer (3).

9 Claims, 12 Drawing Sheets

SEMICONDUCTOR THYRISTOR DEVICE WITH RECESS

BACKGROUND OF THE INVENTION

1. Field of the Invention

The present invention relates to a semiconductor device and a method of fabricating the same and, more particularly, to an improvement in a composite semiconductor device including a plurality of semiconductor elements which are electrically isolated from each other through an isolating region and are formed on a single substrate.

2. Description of the Background

1. First Background Art

Structure

FIG. 9 is a cross-sectional view of a conventional reverse-conducting thyristor 500 disclosed in Japanese Patent Application Laid-Open No. 1-39223. The reverse-conducting thyristor 500 comprises a thyristor portion X and a diode portion Y which are electrically isolated from each other by an isolating portion Z.

A semiconductor substrate 500T of the reverse-conducting thyristor 500 includes an n-type base layer 1 ($n_B$), a p-type base layer 2 ($P_B$) formed in a region corresponding to the thyristor portion X in the upper surface of the n-type base layer 1, and a p layer 3 in the diode portion Y. There are provided n-type emitter layers 4 ($n_E$) selectively arranged in the upper surface of the p-type base layer 2.

On the lower major surface of the n-type base layer 1, an n-type high-concentration layer 6 is formed for ohmic contact between an electrode layer 14 and the n-type base layer 1. A p-type emitter layer 5 ($p_E$) is formed in a region of the n-type high-concentration layer 6 which is opposed to the n-type emitter layers 4.

The semiconductor substrate 500T having such arrangement is formed with a plurality of electrode layers. Cathode electrode layers 11 are formed on the n-type emitter layers 4 and are connected in common to an electrode layer 12 formed on the p layer 3. Gate electrode layers 13 are selectively formed on the p-type base layer 2. Parts of the upper major surface which are not covered with the electrode layers 11, 13 and 14 are protected by oxide films 20. The anode electrode layer 14 is formed on the lower major surface of the semiconductor substrate 500T.

Operation

In the reverse-conducting thyristor 500, a positive voltage is applied to the anode electrode layer 14, and a negative voltage is applied to the cathode electrode layers 11 and the electrode layer 12 on the p layer 3. Then a pn junction between the n-type base layer 1 and the p-type base layer 2 and a pn junction between the n-type base layer 1 and the p layer 3 are biased in the reverse direction, so that the reverse-conducting thyristor 500 enters a blocking state.

In this state, when a gate voltage positive with respect to the cathode electrode layers 11 is applied to the gate electrode layers 13, holes are introduced from the gate electrode layers 13 to cause the thyristor portion X to conduct. Then the reverse-conducting thyristor 500 turns on.

By applying a gate voltage negative with respect to the cathode electrode layers 11 to the gate electrode layers 13, the turn-off time is controlled in the reverse-conducting thyristor 500. The reverse-conducting thyristor 500 may be turned off directly by adjusting the negative gate voltage.

On the other hand, when a negative voltage is applied to the anode electrode layer 14 and a positive voltage is applied to the cathode electrode layers 11 and the electrode layer 12, the diode portion Y conducts.

The reverse-conducing thyristor 500 has thyristor characteristics when the positive voltage is applied to the anode electrode layer 14 and the negative voltage is applied to the cathode electrode layers 11 and the electrode layer 12, and has diode characteristics when the negative voltage is applied to the anode electrode layer 14 and the positive voltage is applied to the cathode electrode layers 11 and the electrode layer 12. Thus the diode portion Y functions as a flywheel diode.

2. Second Background Art

FIG. 10 is a cross-sectional view of a conventional reverse-conducting turn-off thyristor (hereinafter referred to as a "reverse-conducting GTO") 600 disclosed in IEEE PESC 88 RECORD (April 1988), pp. 908–914. Principal differences of the reverse-conducing GTO 600 from the reverse-conducting thyristor 500 of FIG. 9 will be described below.

The reverse-conducting GTO 600 comprises a p layer 7 in the isolating portion Z for the purpose of preventing the reverse-conducting GTO 600 from being broken down.

Specifically, when a positive voltage is applied to the anode electrode layer 14 and a negative voltage is applied to the cathode electrode layers 11 and the electrode layer 12, the pn junction between the n-type base layer 1 and the p-type base layer 2 and the pn junction between the n-type base layer 1 and the p layer 3 are biased in the reverse direction, so that a depletion layer extends in the n-type base layer 1 having a low carrier concentration. If the p layer 7 is absent at that time, an intense electric field is generated about the isolating portion Z in the upper major surface of a semiconductor substrate 600T to break down the reverse-conducting GTO 600.

On the other hand, when some voltage or more is applied between the anode electrode layer 14 and the electrode layers 11, 12, if the p layer 7 is present, respective depletion layers in the thyristor portion X and in the diode portion Y are linked together through the p layer 7 to be integrated (pinchoff state). The integrated depletion layers extend on the bulk side of the n-type base layer 1 and, as a result, breakdown is prevented in the upper major surface of the semiconductor substrate 600T.

The reverse-conducting GTO 600 comprises a recess 21 formed by excavating the upper surface of the semiconductor substrate 600T over the isolating portion Z and opposite sides thereof, and a recess 22 between the n-type emitter layers 4. Thus the gate electrode layers 13 contact the p-type base layer 2 in the bottom of the recesses 21, 22. Respective parts of the p-type base layer 2 and p layer 3 and the upper portion of the p layer 7 are removed because of the formation of the recess 21.

The recesses 21, 22 are associated with the use of the reverse-conducting GTO 600 in pressure contact form. Specifically, a metal plate is pressed against the cathode electrode layers 11 and the electrode layer 12, whereby electrical connection is achieved between the electrode layers 11, 12 and an external equipment. The gate electrode layers 13 are brought into contact with an external electrode member to achieve electrical contact with external control circuits. For this reason, the electrode layers 11, 12 and the gate electrode layers 13 are required to be disposed in different planes in the reverse-conducting GTO 600.

The reverse-conducting GTO 600 further comprises oxide films 15 formed in the peripheral portion of the exposed surface of the p layer 7, and an electrically floating electrode layer 16 formed on the center of the p layer 7.

Problems of Background Art

In the reverse-conducting thyristor 500 of FIG. 9, to prevent breakdown at the pn junctions between the n-type base layer 1 and the p layers 2, 3, the spacing D1 (See FIG. 11) between the p-type base layer 2 and the p layer 3 must be small. The spacing D1 is, for example, about 30 $\mu$m.

A precise impurity diffusion is, however, required to form the p-type base layer 2 and the p layer 3 such that the spacing therebetween is small. In practice, errors of the width D1 are prone to be produced. This is because a so-called lateral diffusion generated in the impurity diffusion produces errors of practical impurity diffusion distribution even if a mask pattern for diffusion is determined precisely.

Such errors result in the spacing D1 much smaller than a predetermined designed spacing, then causing shorts between the p-type base layer 2 and the p layer 3. This presents the problem that the reverse-conducting thyristor 500 becomes a defective product.

In the reverse-conducting GTO 600 of FIG. 10, on the other hand, a problem arises due to the fact that the p layer 7 is formed in the bottom of the recess 21. When the selective diffusion of p-type impurities into the upper major surface of the n-type base layer 1 follows the formation of the recess 21, a transfer pattern for use in the photolithography process is spaced apart from a diffusion mask layer to be formed on the upper major surface of the n-type base layer 1. This causes undesirable exposure of regions wider than necessary due to light diffusion, so that the spacings between the p layers 2, 3, 7 are not controlled with accuracy.

Conversely, when the formation of the recess 21 by selective etching of the upper major surface follows the formation of the p layers 2, 3, 7, the spacings between the p layers 2, 3, 7 to be determined finally by the selective etching are prone to scatter. Referring to FIG. 12, although a spacing D2 before etching can be controlled directly by the mask for selective diffusion, errors in the selective etching of the upper major surface, if generated, cause a spacing D3 to be determined finally to deviate from a predetermined value. For this reason, it is difficult to precisely control the spacings between the p layers 2, 3, 7.

Further, the oxide films 15 and the floating electrode layer 16 are formed in the bottom of the recess 21 of FIG. 10 by means of the photolithography process in this method, with the transfer pattern spaced apart from the mask layer. This presents the problem that the formation accuracy of the layers 15, 16 decreases due to the foregoing undesirable exposure or the like.

SUMMARY OF THE INVENTION

According to the present invention, a semiconductor device comprises: (a) a first semiconductor layer of a first conductivity type having first and second major surfaces, the first major surface being divided into first, second and third areas, the first and second areas being specified with the third area sandwiched therebetween; (b) a second semiconductor layer of a second conductivity type formed in the first area; (c) a third semiconductor layer of the second conductivity type formed in the second area; (d) at least one fourth semiconductor layer of the second conductivity type selectively formed in the third area and located between the second and third semiconductor layers such that parts of the first semiconductor layer lie between the fourth semiconductor layer and the second and third semiconductor layers, respectively; (e) a first electrode layer formed on the second semiconductor layer; (f) a second electrode layer formed on the third semiconductor layer; and (g) a third electrode layer connected electrically to the second major surface, wherein exposed surfaces of the third semiconductor layer, the fourth semiconductor layer, and the parts of the first semiconductor layer lie in substantially the same plane at the first major surface.

In the semiconductor device, the second semiconductor layer is electrically isolated from the third semiconductor layer. The fourth semiconductor layer and the parts of the first semiconductor layer lie in the isolating portion.

Thus when the pn junctions formed between the first semiconductor layer and the second and third semiconductor layers are reverse-biased, the respective depletion layers extending from the pn junctions are made common through the periphery of the fourth semiconductor layer. This is effective to prevent breakdown. The presence of the fourth semiconductor layer affords a relatively large spacing between the second and third semiconductor layers.

The parts of the first semiconductor layer and the third and fourth semiconductor layers are exposed in substantially the same plane at the first major surface. That is, the isolating structure is not located in the recess. In the formation of the second to fourth semiconductor layers, the spacings between the semiconductor layers are correctly controlled without being affected by the recess.

The parts of the first semiconductor layer include a part lying between the second and fourth semiconductor layers and a part lying between the third and fourth semiconductor layers. If a short-circuit occurs either between the second and fourth semiconductor layers or between the third and fourth semiconductor layers, a short-circuit does not develop between the second and third semiconductor layers as far as the electrical isolation is maintained between the unshorted semiconductor layers.

As a result, defective products are particularly effectively prevented from being made.

Preferably, a plurality of fourth semiconductor layers are arranged between the second and third semiconductor layers.

In another aspect of the present invention, a semiconductor device comprises: (a) a first semiconductor layer of a first conductivity type having first and second major surfaces, the first major surface being divided into first, second, third and fourth areas, the first and second areas being specified with the third area sandwiched therebetween, the fourth area being specified on the opposite side of the first area from the third area; (b) a second semiconductor layer of a second conductivity type formed in the first area; (c) a third semiconductor layer of the second conductivity type formed in the second area; (d) at least one fourth semiconductor layer of the second conductivity type selectively formed in the third area and located between the second and third semiconductor layers such that parts of the first semiconductor layer lie between the fourth semiconductor layer and the second and third semiconductor layers, respectively; (e) at least one fifth semiconductor layer of the second conductivity type selectively formed in the fourth area; (f) a first electrode layer formed on the second semiconductor layer; (g) a second electrode layer formed on the third semiconductor layer; and (h) a third electrode layer connected electrically to the second major surface, wherein exposed surfaces of the third semiconductor layer, the fourth semiconductor layer, the parts of the first semiconductor layer lie in substantially the same plane at the first major surface.

In the semiconductor device of this aspect of the present invention, the fifth semiconductor layer functions as a guard ring. In addition to the above-mentioned functions, the semiconductor device prevents breakdown more effectively. Thus sufficient breakdown preventing effect is achieved when the side face of the semiconductor substrate is not of the bevel structure.

The present invention is also intended for a method of fabricating a semiconductor device. According to the present invention, the method comprises the steps of: (a) providing a first semiconductor layer of a first conductivity type having first and second major surfaces, the first major surface being divided into first, second and third areas, the first and second areas being specified with the third area sandwiched therebetween; (b) selectively introducing an impurity of a second conductivity type into the first major surface to form a second semiconductor layer of the second conductivity type in the first area, a third semiconductor layer of the second conductivity type in the second area, and at least one fourth semiconductor layer of the second conductivity type selectively in the third area and located between the second and third semiconductor layers, with parts of the first semiconductor layer lying between the fourth semiconductor layer and the second and third semiconductor layers, respectively, such that exposed surfaces of the third semiconductor layer, the fourth semiconductor layer, and the parts of the first semiconductor layer lie in substantially the same plane at the first major surface; (c) forming a first electrode layer on the second semiconductor layer; (d) forming a second electrode layer on the third semiconductor layer; and (e) forming a third electrode layer connected electrically to the second major surface.

In another aspect of the present invention, a method of fabricating a semiconductor device, comprises the steps of: (a) forming a first semiconductor layer of a first conductivity type having first and second major surfaces, the first major surface being divided into first, second, third and fourth areas, the first and second areas being; specified with the third area sandwiched therebetween, the fourth area being specified on the opposite side of the first area from the third area; (b) selectively introducing an impurity of a second conductivity type into the first major surface to form a second semiconductor layer of the second conductivity type in the first area, a third semiconductor layer of the second conductivity type in the second area, at least one fourth semiconductor layer of the second conductivity type selectively in the third area and located between the second and third semiconductor layers, with parts of the first semiconductor layer lying between the fourth semiconductor layer and the second and third semiconductor layers, respectively, and at least one fifth semiconductor layer of the second conductivity type selectively in the fourth area, such that exposed surfaces of the third semiconductor layer, the fourth semiconductor layer and the parts of the first semiconductor layer lie in substantially the same plane at the first major surface; (c) forming a first electrode layer on the second semiconductor layer; (d) forming a second electrode layer on the third semiconductor layer; and (e) forming a third electrode layer connected electrically to the second major surface.

According to the method of fabricating the semiconductor device of the present invention, the semiconductor device having the above-mentioned functions is fabricated.

An object of the present invention is to provide a semiconductor device which effectively prevents breakdown around an isolating portion and facilitates precise formation of a semiconductor layer pattern therearound to prevent a defective product from being made, and a method of fabricating the same.

These and other objects, features, aspects and advantages of the present invention will become more apparent from the following detailed description of the present invention when taken in conjunction with the accompanying drawings.

DESCRIPTION OF THE PREFERRED EMBODIMENTS

1. First Preferred Embodiment

Structure

Figure 1:
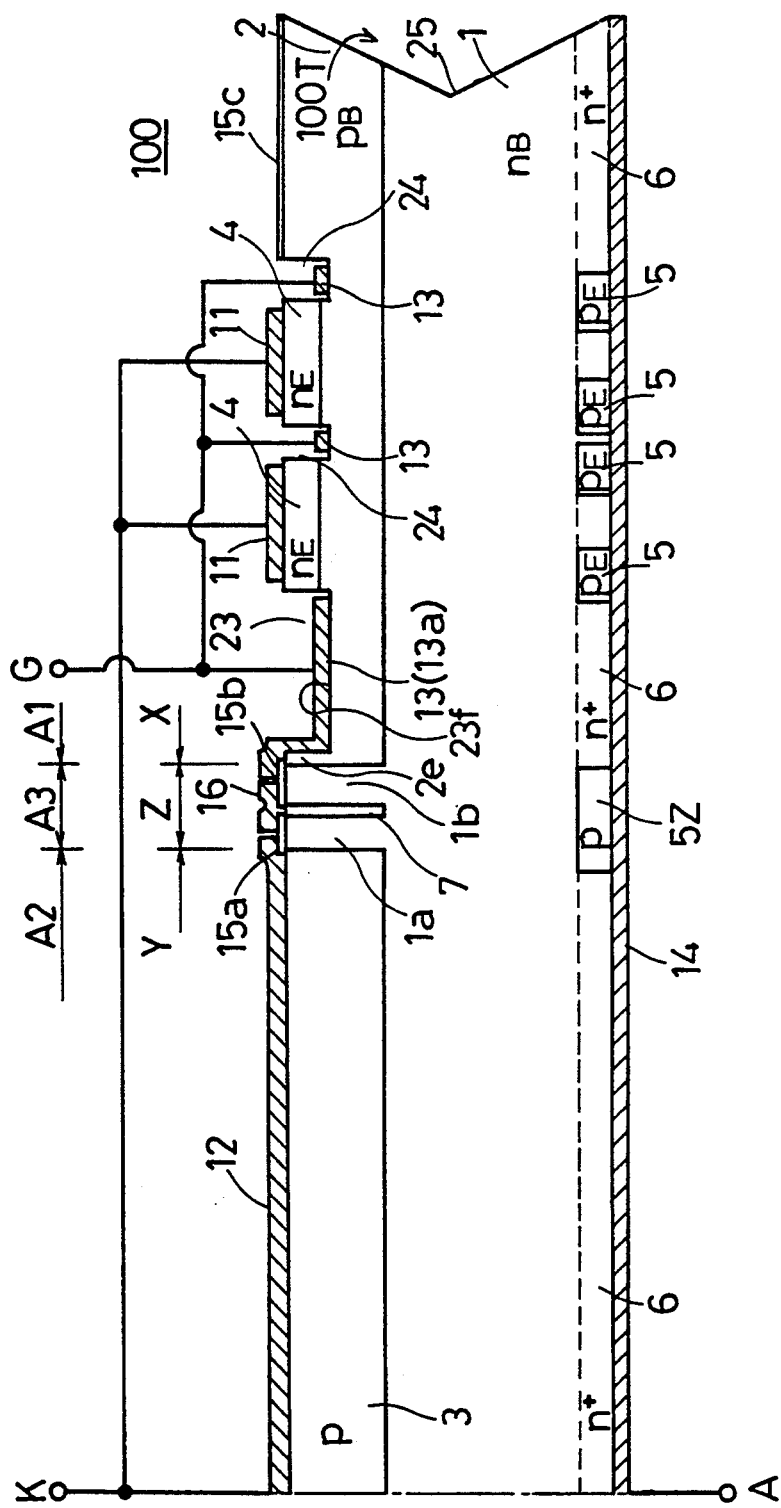
FIG. 1 is a cross-sectional view of a reverse-conducting GTO according to a first preferred embodiment of the present invention.

FIG. 1 is a cross-sectional view of a reverse-conducting GTO 100 according to a first preferred embodiment of the present invention. Only the right half of the reverse-conducting GTO 100 is shown in FIG. 1, and the left half thereof is symmetrical to the right half with respect to the dashed-and-dotted line.

The reverse-conducting GTO 100 comprises a GTO portion X and a diode portion Y which are electrically isolated from each other by an isolating portion Z.

The upper major surface of a semiconductor substrate (silicon substrate) 100T corresponding to the body of the reverse-conducting GTO 100 is conceptually divided into first, second and third areas A1, A2, A3 in corresponding relation to the portions X, Y, Z.

The semiconductor substrate 100T includes an n-type base layer 1 ($n_B$), a p-type base layer 2 ($p_B$) formed in the first area A1 (GTO portion X) in the upper major surface of the n-type base layer 1, and a p layer 3 formed in the second area A2 (diode portion Y). The upper surface of the p-type base layer 2 is selectively removed to define recesses 23 and 24.

Between the recesses 23 and 24 are arranged n-type emitter layers 4 ($n_E$) the upper surfaces of which are substantially flush with the upper surface of the p-type base layer 2.

A p layer 7 is formed in a section between the p-type base layer 2 and the p layer 3, i.e., in the third area A3 (isolating portion Z). The p layer 7 is spaced apart from the p-type base layer 2 and the p layer 3, with portions 1a and 1b of the n-type base layer 1 lying therebetween. The p layers 2, 3 and 7 have substantially the same depth which is, for example, 80 to 90 μm from the upper major surface of the semiconductor substrate 100T.

Oxide films 15a and 15b are formed on the portions 1a and 1b of the n-type base layer 1. An oxide film 15c is formed adjacent the side face of the semiconductor substrate 100T on the upper surface of the p-type base layer 2.

On the lower major surface of the n-type base layer 1 is formed an n-type high-concentration layer 6 for ohmic contact between an electrode layer 14 and the n-type base layer 1. Further, p-type emitter layers 5 ($p_E$) are formed in a region of the n-type high-concentration layer 6 which is opposed to the n-type emitter layers 4.

A plurality of electrode layers are formed in the semiconductor substrate 100T. Cathode electrode layers 11 are formed on the n-type emitter layers 4 and are connected in common to an electrode layer 12 formed on the p layer 3. An end of the electrode layer 12 extends into the third area A3 to partially cover the oxide film 15a.

Gate electrode layers 13 are formed in the bottoms of the recesses 23, 24, respectively. The gate electrode layer 13 includes a gate electrode layer 13a lying in the bottom 23f of the recess 23 and extending into the third area A3 to partially cover the oxide film 15b.

An electrode layer 16 is formed over the oxide films 15a and 15b and contacts the p layer 7 through a window between the oxide films 15a and 15b. The electrode layer 16 is spatially isolated from the electrode layers 12 and 13 and is in electrically floating state.

The anode electrode layer 14 is formed on the lower major surface of the semiconductor substrate 100T. A bevel 25 is defined on the side face of the semiconductor substrate 100T.

The detailed structure and size of the p-type layer 7 and its adjacent portion will be described later in conjunction with the fabrication process of the reverse-conducting GTO 100.

Operation and Characteristics

Figure 2:
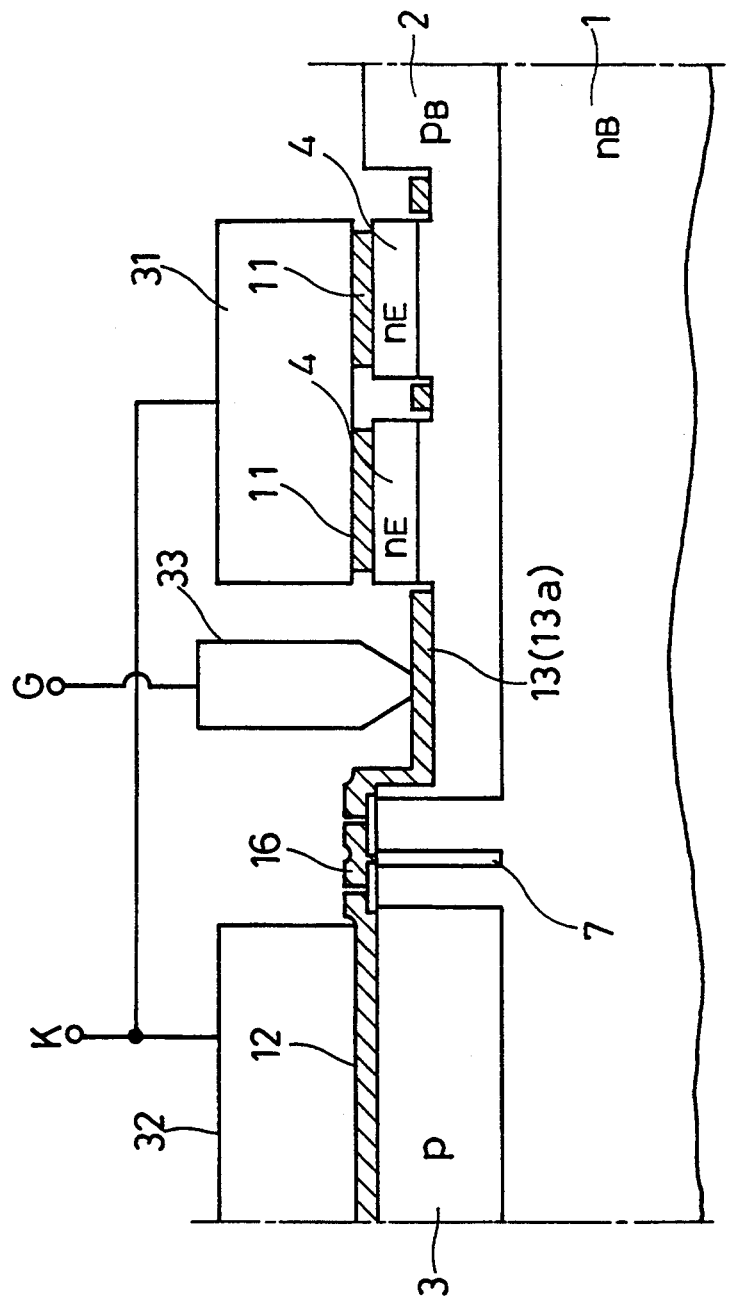
FIG. 2 is a partially enlarged cross-sectional view showing electrical connection to external electrodes in the reverse-conducting GTO of FIG. 1.

In operation of the reverse-conducting GTO 100, as shown partially on an enlarged scale in FIG. 2, external conductive blocks 31 and 32 are pressed against the cathode electrode layers 11 and the electrode layer 12, respectively. The external conductive blocks 31 and 32 are short-circuit connected to each other. A conductive block not shown in FIG. 2 is pressed against the anode electrode layer 14 of FIG. 1. An external gate electrode 33 is abutted against the gate electrode layer 13 and is urged toward the gate electrode layer 13 by a spring not shown.

In this state, the reverse-conducting GTO 100 performs substantially the same turn on/off operation as the conventional reverse-conducting GTO when voltage is applied to the cathode electrode layers 11, the electrode layer 12, the gate electrode layers 13, and the anode electrode layer 14.

Specifically, a positive voltage is applied to the anode electrode layer 14 whereas a negative voltage is applied to the cathode electrode layers 11 and the electrode layer 12, and a gate voltage that is positive with respect to the cathode electrode layers 11 is applied to the gate electrode layers 13. Then the reverse-conducting GTO 100 turns on. When a gate voltage that is negative with respect to the cathode electrode layers 11 is applied to the gate electrode layers 13, the reverse-conducting GTO 100 turns off. The diode portion Y functions as a flywheel diode.

In the reverse-conducting GTO 100, when pn junctions between the n-type base layer 1 and the p layers 2, 3 are biased in the reverse direction, respective depletion layers extending from the pn junctions toward the n-type base layer 1 are made common in the vicinity of the p-type layer 7. This is effective to prevent breakdown.

Surfaces of the p layer 3, the portions 1a, 1b of the n-type base layer 1, a left end portion 2e of the p-type base layer 2, and the p layer 7 which are exposed at the upper major surface of the semiconductor substrate 100T lie in the same plane substantially parallel to the upper major surface of the semiconductor substrate 100T. It will be appreciated from the fabrication process to be described later that doping of the isolating portion Z is permitted without the photolithography process through the recesses and the spacing between the p layers 2, 3 and 7 are easily controlled.

The photolithography technique used in the isolating portion Z for forming the oxide films 15a, 15b and the electrode layers 12, 13, 16 does not cause the undesirable exposure of the mask layers therefor due to light diffusion.

If a short-circuit occurs between the p-type base layer 2 and the p-type layer 7, a short-circuit does not develop between the p-type base layer 2 and the p layer 3 as far as the electrical isolation is maintained between the p-type layers 3 and 7. Likewise, if a short-circuit occurs between the p layers 3 and 7, a short-circuit does not develop between the p-type base layer 2 and the p layer 3 as far as the electrical isolation is maintained between the p-type base layer 2 and the p layer 7. Since there is a very low probability that the two short-circuits occur simultaneously, the electrical isolation between the p-type base layer 2 and the p layer 3 is not substantially hindered. The spacing between the p-type base layer 2 and the p layer 3 is enabled to be large by the provision of the p layer 7 therebetween, and a direct short-circuit therebetween is also prevented.

Fabrication Process

FIGS. 3 to 6 are partially enlarged cross-sectional views showing the fabrication process of the reverse-conducting GTO 100.

Figure 3:
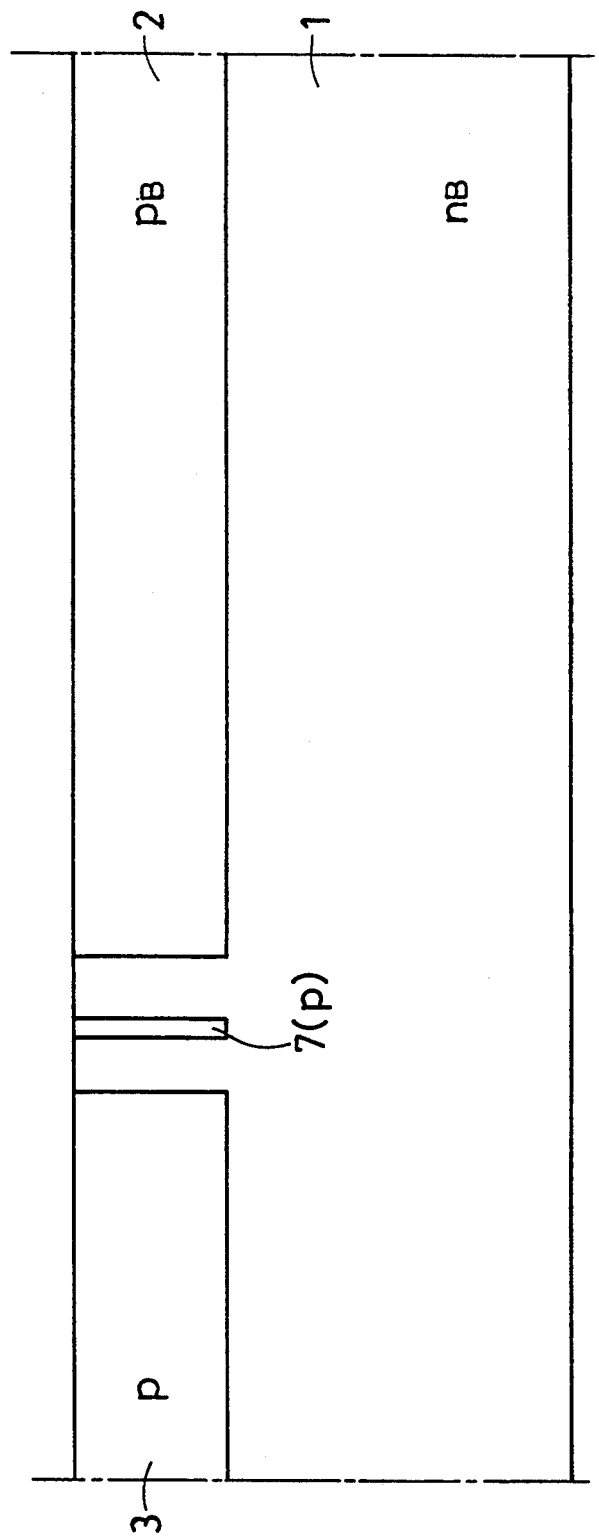
FIG. 3 is a partial cross-sectional view showing the fabrication process of the reverse-conducting GTO of FIG. 1.

Referring to FIG. 3, boron is selectively diffused into the upper major surface of a semiconductor wafer including the n-type base layer 1 to form the p-type base layer 2, the p layer 3 and the p layer 7.

Figure 4:
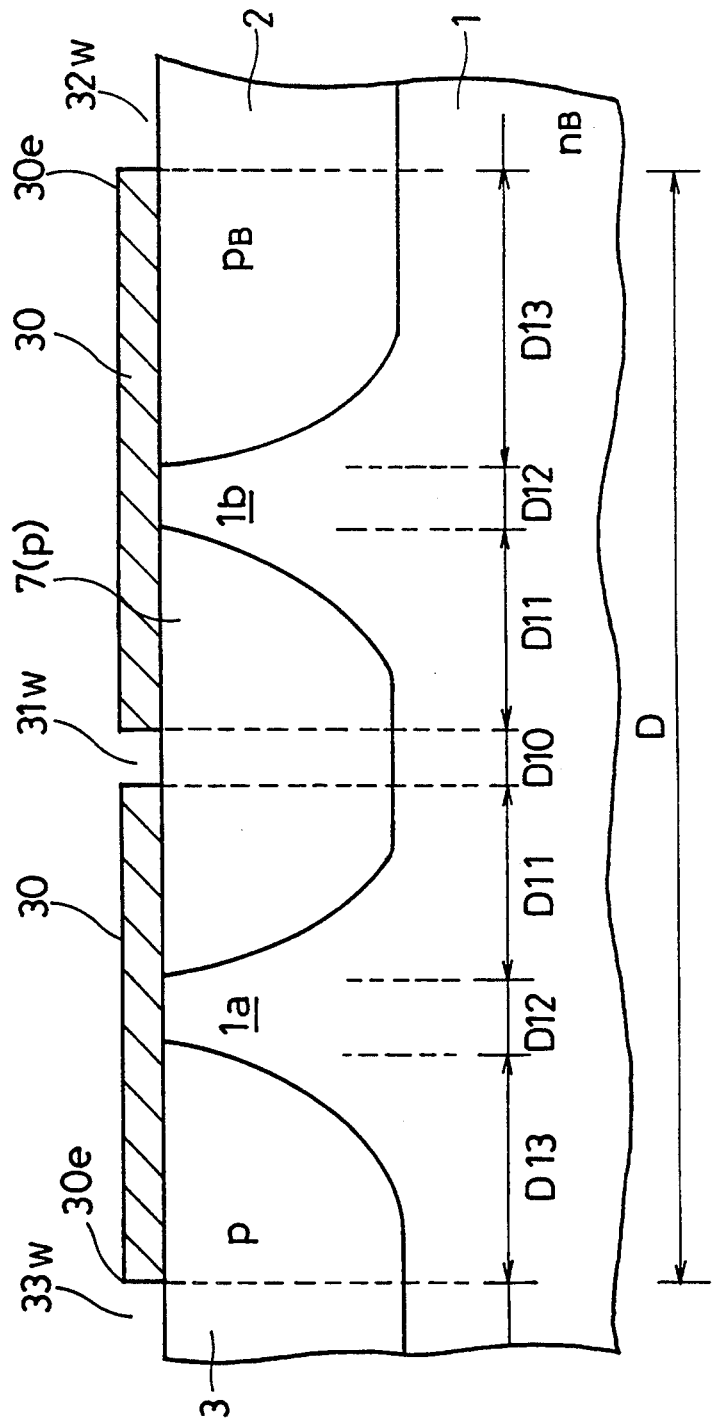
FIG. 4 is a partial cross-sectional view showing details of an isolating portion of the reverse-conducting GTO of FIG. 1.
Figure 5:
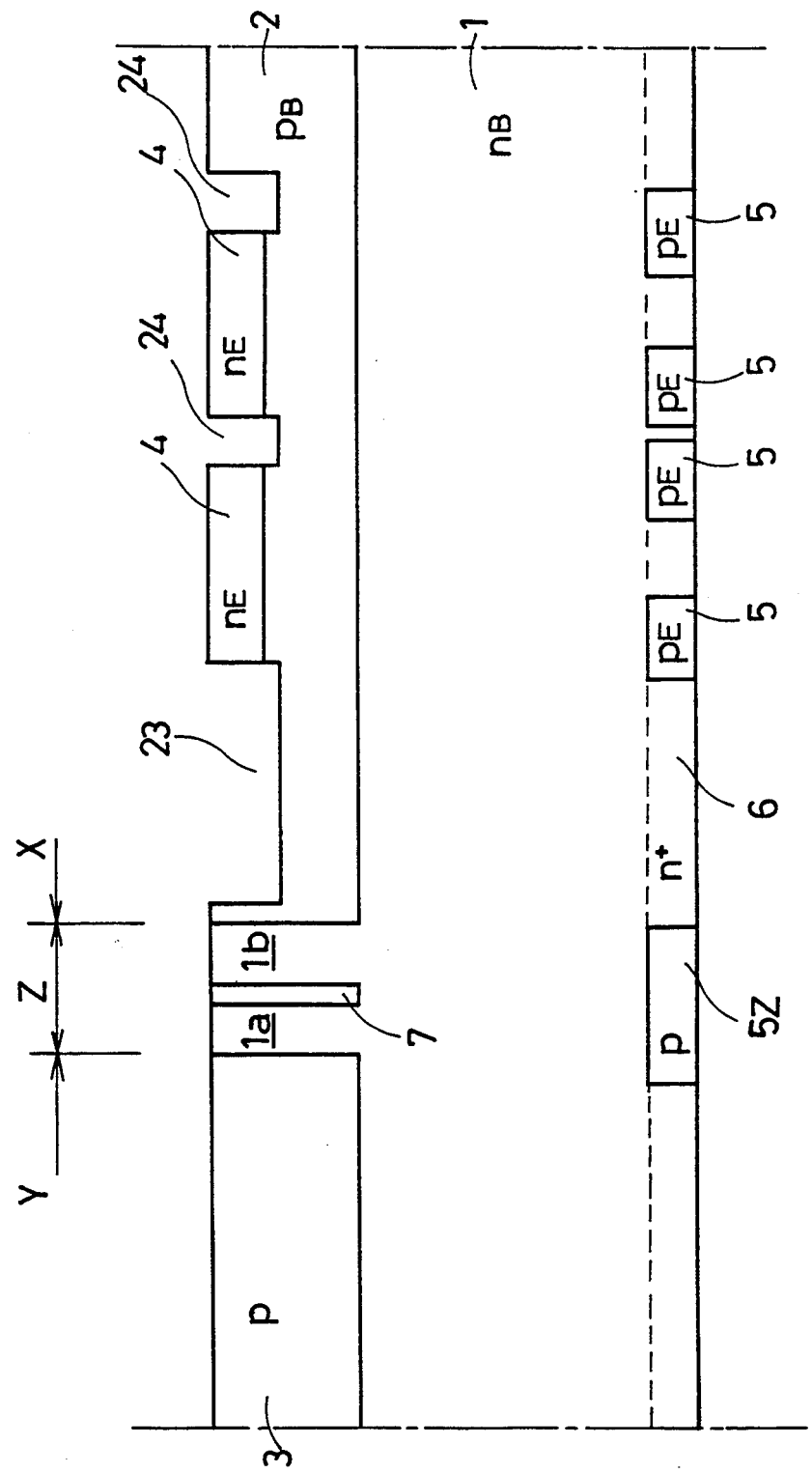
FIGS. 5 and 6 are partial cross-sectional views showing the fabrication process of the reverse-conducting GTO of FIG. 1.

The details of this process are shown in FIG. 4. For convenience of illustration, detailed diffusion distribution of the p layers 2, 3 and 7 by lateral diffusion is not shown in FIG. 1. Practical impurity distribution has a configuration shown in FIG. 4.

In FIG. 4, a mask material is formed over the entire upper major surface of the n-type base layer 1 and is then selectively etched by means of the photolithography process to provide a mask pattern layer 30. The mask pattern layer 30 has windows $31w$ to $33w$, and the width D10 of the window $31w$ centrally of the position at which the p layer 7 is to be formed is, for example, about 20 μm. A distance D between opposed ends $30e$ of the mask patter layer 30 of FIG. 4 is about 260 μm.

Boron is selectively diffused into the n-type base layer 1 through the windows $31w$ to $33w$ of the mask pattern layer 30 to form the p layers 2, 3, and 7. The diffusion depth is about 80 to 90 μm, for example.

The diffusion is accompanied by lateral diffusion of boron. The lateral diffusion causes the p layers 2, 3, 7 to extend, for example, D11=D13=about 90 μm in the lateral direction and, accordingly, the width D12 of the respective residual portions $1a$ and $1b$ of the n-type base layer 1 at the upper major surface is about 30 μm.

The spacings D12 between the p layers 2, 3 and 7 are sufficiently small so that the depletion layers, if extending from the pn junctions between the n-type base layer 1 and the p layers 2, 3, are integrated or made common satisfactorily through the periphery of the p layer 7. The pattern design is performed easily because of the pattern width D that is very large.

Further, as above described, since the mask material layer does not lie in the recesses but on the upper major surface when the mask pattern layer 30 is patterned, the undesirable exposure due to light diffusion does not occur in the photolithography process.

To prevent breakdown, it is preferable that the width D1 is not more than about 40 μm, more preferably not more than about 30 μm. The structure of FIG. 4 meets this condition.

In the next step for fabrication (FIG. 5), phosphorus is selectively diffused into the lower major surface of the n-type base layer 1 to form the n-type high-concentration layer 6. Boron is selectively diffused into parts of the n-type high-concentration layer 6 which are opposed to the n-type emitter layers 4 and the isolating portion Z to a depth of about 30 μm, to form a p layer 5Z and the p-type emitter layers 5.

Phosphorus is selectively diffused into the upper surface of the p-type base layer 2 to a depth of about 20 μm to form the n-type emitter layers 4. Subsequently the p-type base layer 2 is selectively etched to a depth of about 30 μm to form the recesses 23, 24.

Figure 6:
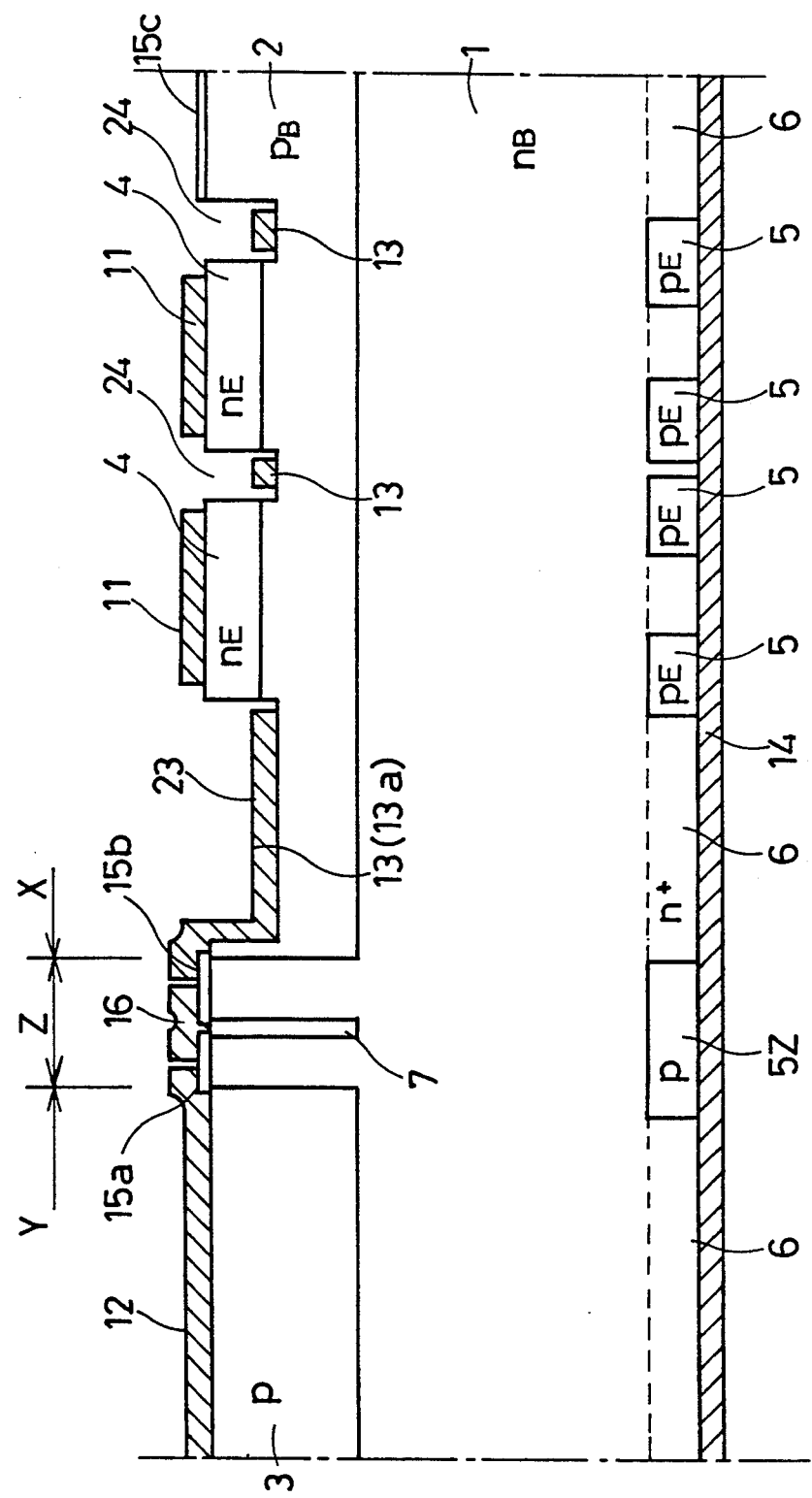

As shown in FIG. 6, the oxide films $15a$, $15b$ and $15c$ are selectively formed on the upper major surface. Aluminum layers are formed and then selectively etched to form the electrode layers 11, 12, 13, 14. This completes the major part of the reverse-conducting GTO 100.

2. Second Preferred Embodiment

Figure 7:
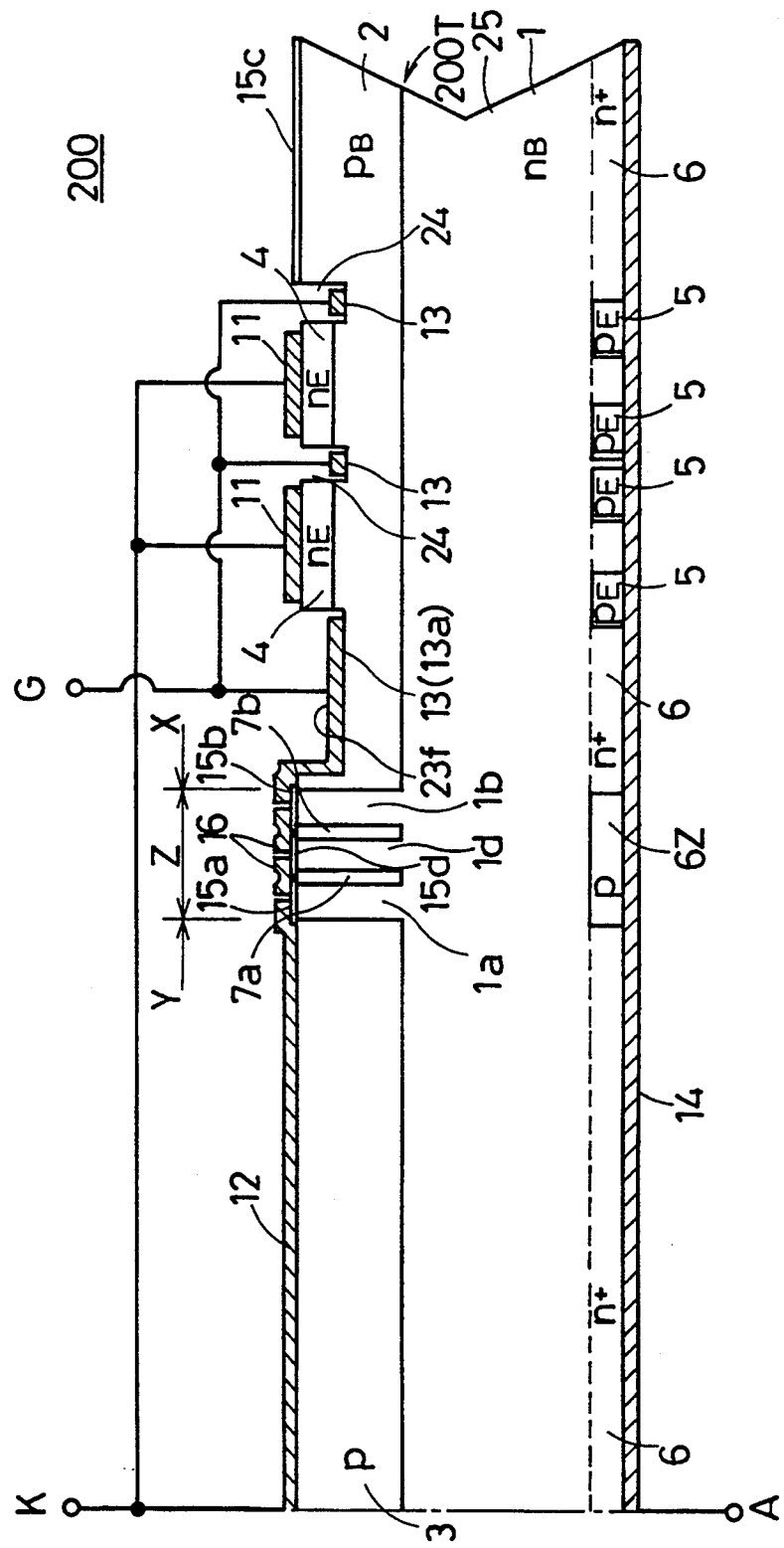
FIG. 7 is a cross-sectional view of the reverse-conducting GTO according to a second preferred embodiment of the present invention.

FIG. 7 is a cross-sectional view of a reverse-conducting GTO 200 according to a second preferred embodiment of the present invention. A semiconductor substrate 200T of the reverse-conducting GTO 200 includes a plurality of spaced p layers $7a$ and $7b$ in the isolating portion Z. The spacing between the p layers $7a$ and $7b$ is substantially equal to the spacing between the p layer 3 and the p layer $7a$ and the spacing between the p-type base layer 2 and the p layer $7b$, and is preferably not more than about 40 μm, more preferably not more than about 30 μm.

Portions $1a$, $1d$, $1b$ of the n-type base layer 1 lie between the p layers 3, $7a$, $7b$, 2, respectively. Oxide films $15a$, $15d$, $15b$ are formed on the isolating portion Z, and the float electrode layers $15a$ and $15b$ are connected to the p layers $7a$ and $7b$, respectively. Other arrangements of the reverse-conducting GTO 200 are identical with those of the reverse-conducting GTO 100 of FIG. 1.

In the reverse-conducting GTO 200, the spacing between the p-type base layer 2 and the p layer 3 may be increased because of the presence of the plurality of players $7a$ and $7b$. The probability that short-circuit occurs in all of the portions $1a$, $1d$ and $1b$ of the n-type base layer 1 in the reverse-conducting GTO 200 is lower than that in the reverse-conducting GTO 100 of FIG. 1.

The pinchoff phenomenon by the p layers 3, $7a$, $7b$, 2 increases resistance to breakdown and is effective to prevent defective products associated with short-circuits from being produced.

It has been confirmed according to experiments by the inventor(s) of the present invention that the aforesaid arrangement achieves a breakdown voltage of 2500 to 3000 V of the reverse-conducting GTO.

It should be noted that the reverse-conducting GTO 200 is fabricated by the same fabrication process as the reverse-conducting GTO 100 of FIG. 1, wherein the p layers $7a$ and $7b$ are obtained in place of the p layer 7 in FIG. 4.

3. Third Preferred Embodiment

Figure 8:
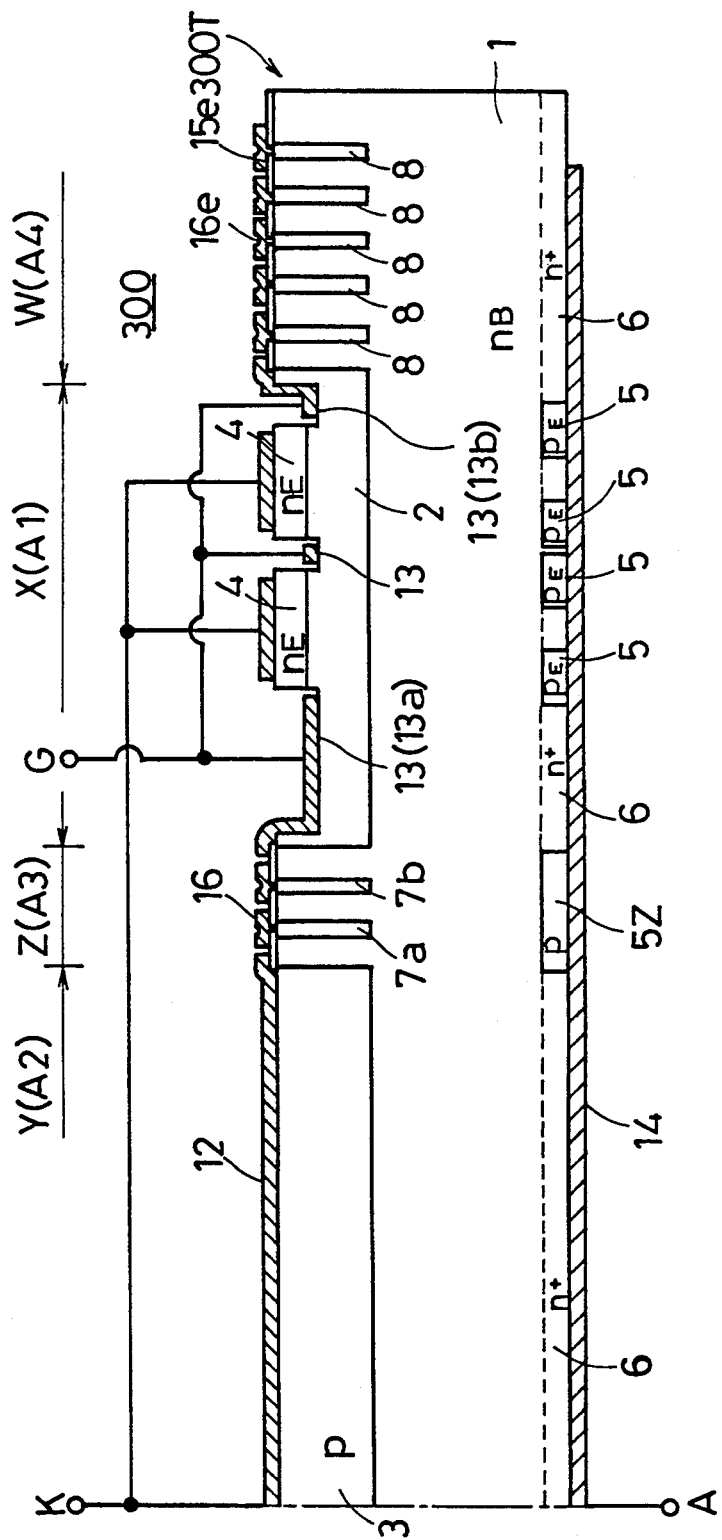
FIG. 8 is a cross-sectional view of the reverse-conducting GTO according to a third preferred embodiment of the present invention.
Figure 9:
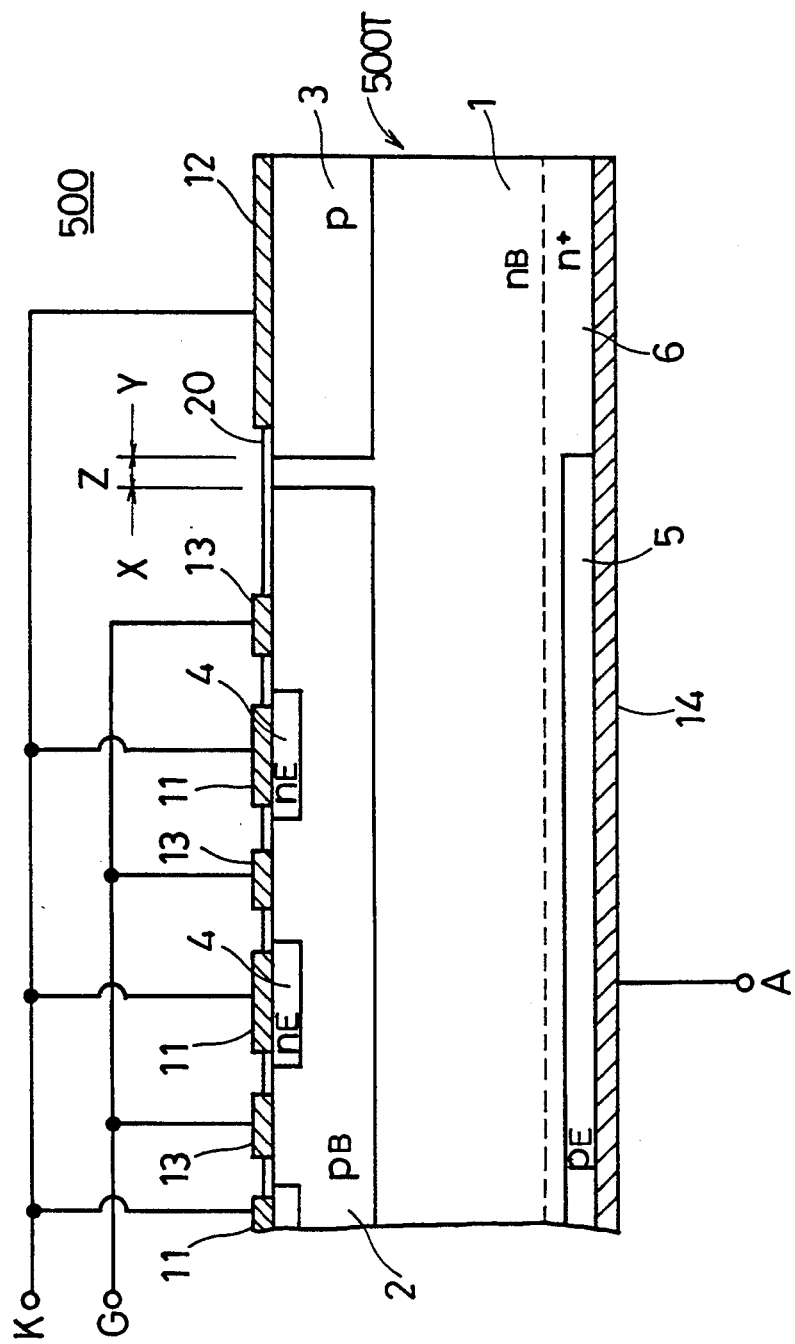
FIG. 9 is a cross-sectional view of a conventional reverse-conducting thyristor.
Figure 10:
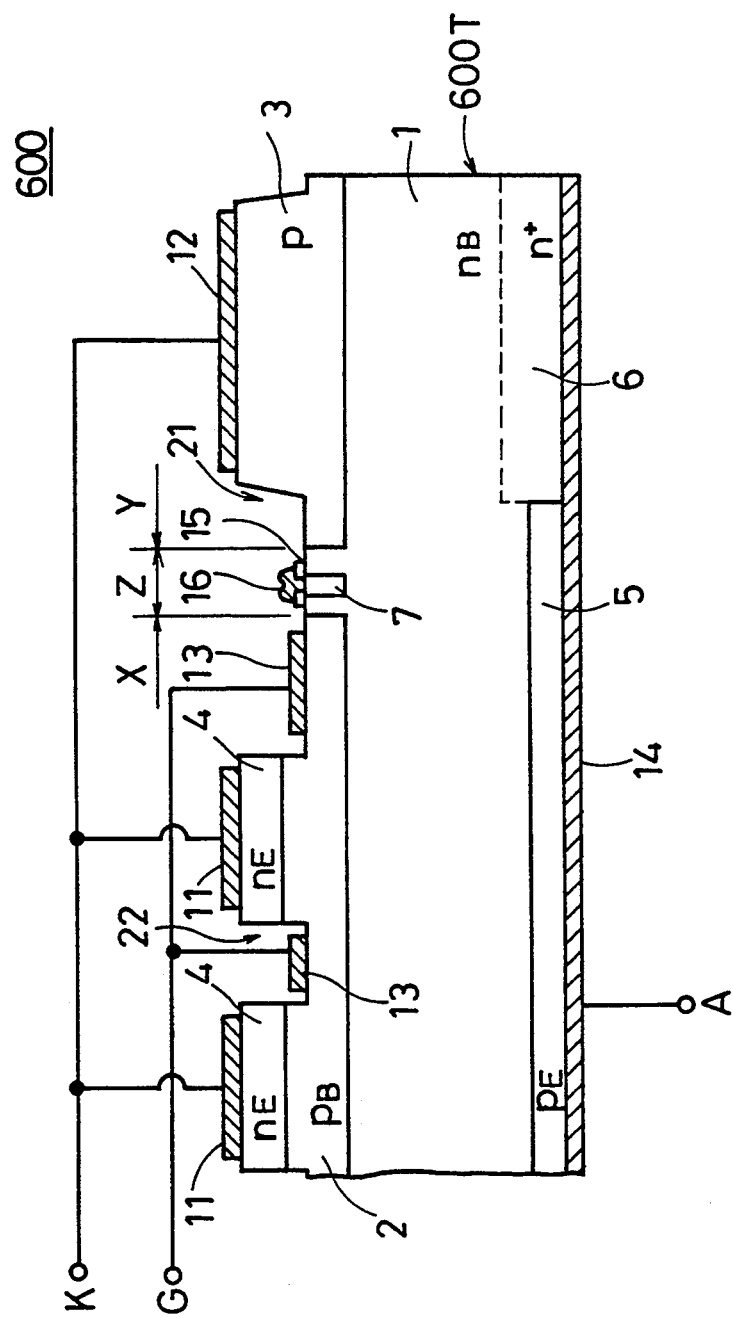
FIG. 10 is a cross-sectional view of a conventional reverse-conducting GTO.
Figure 11:
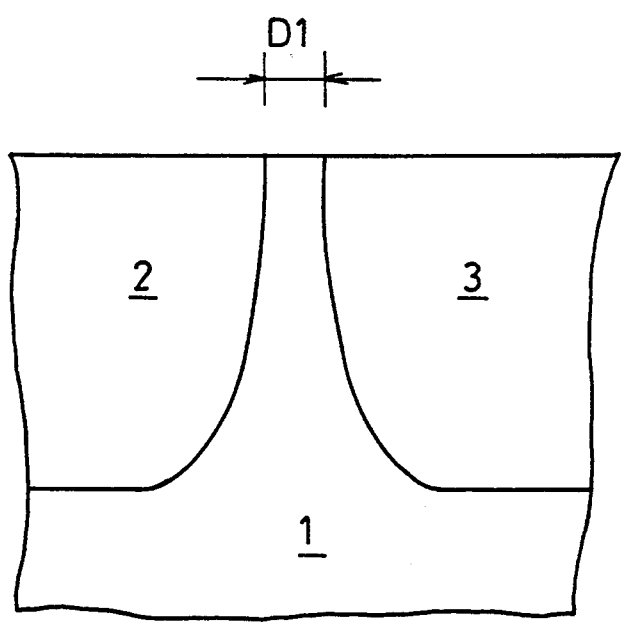
FIG. 11 is a partially enlarged cross-sectional view for delineating problems of the reverse-conducting thyristor of FIG. 9.
Figure 12:
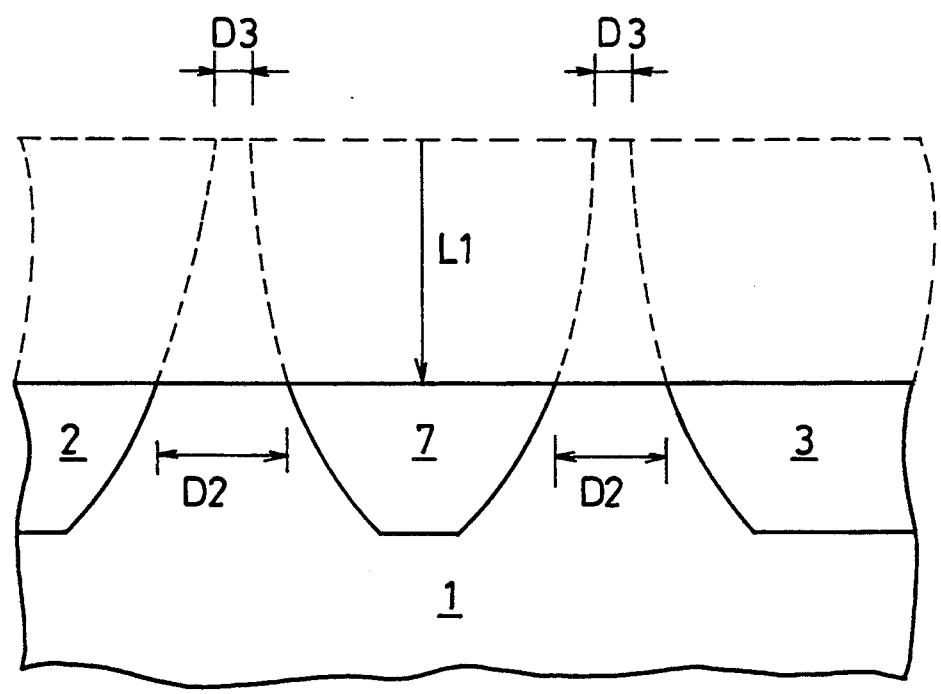
FIG. 12 is a partially enlarged cross-sectional view for delineating problems of the reverse-conducting GTO of FIG. 10.

FIG. 8 is a cross-sectional view of a reverse-conducting GTO 300 according to a third preferred embodiment of the present invention. A semiconductor substrate 300T of the reverse-conducting GTO 300 includes the plurality of spaced p layers $7a$ and $7b$ in the isolating portion Z in the same fashion as the reverse-conducting GTO 200 of FIG. 7.

The reverse-conducting GTO 300 includes a fourth area A4 specified on the opposite side of the first area A1 from the third area A3. In the fourth area A4, the p-type base layer 2 is absent but a plurality of p layers 8 are arranged in equally spaced relation in the upper major surface of the n-type base layer 1. An array of oxide films $15e$ and float electrodes $16e$ are selectively formed on the fourth area A4. A portion $13b$ of the gate electrode layer 13 extends into part of the fourth area A4.

The plurality of p layers 8 function as a guard ring. Specifically, the depletion layers produced when the n-type base layer 1 and the p layers 2, 3 are reverse-biased are made common through the p layers $7a$, $7b$, 8 to prevent breakdown.

The reverse-conducting GTO 300 having the guard ring region W is allowed to greatly increase the breakdown voltage without the positive bevel structure 25 of the reverse conducting GTOs 100 and 200 of FIGS. 1 and 7 or a negative bevel structure.

The reverse-conducting GTO 300 is provided by forming the p layers 8 by diffusion at the same time with the p layers 2, 3, 7a, 7b in the same fabrication process as the reverse-conducting GTO 100 of FIG. 1.

Modifications (1) The depths of the respective p layers 2, 3, 7, 8 may be equal or different. To provide the equal depths, the layers 2, 3, 7, 8 may be formed simultaneously by the aforesaid single diffusion step. For achievement of an optimum breakdown voltage, the p layers 8 may be shallower than the p layers 7 (7a, 7b).

(2) The array of the p layers 7 in the isolating portion Z may include three p layers or more. Although the plurality of p layers 8 are preferably formed in FIG. 8, a single p layer 8 is permitted.

(3) The present invention is not limited to the reverse-conducting GTO but is applicable to general semiconductor devices such as general thyristors, gate turn-off thyristors, insulated gate bipolar transistors (IGBTs), high-power transistors and the like which include a plurality of elements formed in parallel in electrically isolated relation on a single semiconductor substrate.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
 (a) a first semiconductor layer of a first conductivity type having first and second major surfaces, said first major surface being divided into first, second and third areas, said first and second areas being specified with said third area sandwiched therebetween;
 (b) a second semiconductor layer of a second conductivity type formed in said first area;
 (c) a third semiconductor layer of the second conductivity type formed in said second area;
 (d) at least one fourth semiconductor layer of the second conductivity type selectively formed in said third area and located between said second and third semiconductor layers such that parts of said first semiconductor layer lie between said fourth semiconductor layer and said second and third semiconductor layers, respectively;
 (e) a first electrode layer formed on said second semiconductor layer;
 (f) a second electrode layer formed on said third semiconductor layer;
 (g) a third electrode layer connected electrically to said second major surface,
 wherein exposed surfaces of said third semiconductor layer, said fourth semiconductor layer, and said parts of said first semiconductor layer lie in substantially the same plane at said first major surface;
 wherein said first electrode layer includes a plurality of first electrode layers selectively formed on said first area,
 said semiconductor device further comprising:
 (h) fifth semiconductor layers of the first conductivity type formed alternately with said electrode layers on said first area; and
 (i) fourth electrode layers formed on said fifth semiconductor layers and connected electrically to said second electrode layer;
 wherein said first area defines a recess having a bottom surface that is lower than surfaces of said second and third areas,
 said first electrode layers are formed in a first portion of said recess, and
 said fifth semiconductor layers are formed in a second portion of said recess that is adjacent said first portion of said recess.

2. The semiconductor device of claim 1, wherein the spacing between said second semiconductor layer and said fourth semiconductor layer is substantially equal to the spacing between said third semiconductor layer and said fourth semiconductor layer in a direction parallel to said first major surface.

3. The semiconductor device of claim 2, wherein said at least one fourth semiconductor layer includes:
 (d-1) a plurality of fourth semiconductor layers of the second conductivity type arranged in substantially equally spaced apart relation in the direction parallel to said first major surface.

4. The semiconductor device of claim 3, further comprising:
 (j) a sixth semiconductor layer of the first conductivity type formed on said second major surface, the impurity concentration of said sixth semiconductor layer being higher than that of said first semiconductor layer; and
 (k) a seventh semiconductor layer of the second conductivity type selectively formed in said sixth semiconductor layer.

5. A semiconductor device comprising:
 (a) a first semiconductor layer of a first conductivity type having first and second major surfaces, said first major surface being divided into first, second, third and fourth areas, said first and second areas being specified with said third area sandwiched therebetween, said fourth area being specified on the opposite side of said first area from said third area;
 (b) a second semiconductor layer of a second conductivity type formed in said first area;
 (c) a third semiconductor layer of the second conductivity type formed in said second area;
 (d) at least one fourth semiconductor layer of the second conductivity type selectively formed in said third area and located between said second and third semiconductor layers such that parts of said first semiconductor layer lie between said fourth semiconductor layer and said second and third semiconductor layers, respectively;
 (e) at least one fifth semiconductor layer of the second conductivity type selectively formed in said fourth area;
 (f) a first electrode layer formed on said second semiconductor layer;
 (g) a second electrode layer formed on said third semiconductor layer;
 (h) a third electrode layer connected electrically to said second major surface,
 wherein exposed surfaces of said third semiconductor layer, said fourth semiconductor layer, and said parts of said first semiconductor layer lie in substantially the same plane at said first major surface;

wherein said first electrode layer includes a plurality of first electrode layers selectively formed on said first area, said semiconductor device further comprising:
(i) sixth semiconductor layers of the first conductivity type formed alternately with said first electrode layers on said first area;
(j) fourth electrode layers formed on said sixth semiconductor layers and connected electrically to said first electrode layers;

wherein said first area defines a recess having a bottom that is lower than surfaces of said second and third areas, said first electrode layers are formed in a first portion of said recess, and said sixth semiconductor layers are formed in a second portion of said recess that is adjacent said first portion of said recess.

6. The semiconductor device of claim 5, wherein the spacing between said second semiconductor layer and said fourth semiconductor layer is substantially equal to the spacing between said third semiconductor layer and said fourth semiconductor layer in a direction parallel to said first major surface.

7. The semiconductor device of claim 6, wherein said at least one fourth semiconductor layer includes:
(d-1) a plurality of fourth semiconductor layers of the second conductivity type arranged in substantially equally spaced apart relation in the direction parallel to said first major surface.

8. The semiconductor device of claim 7, wherein said at least one fifth semiconductor layer includes:
(e-1) a plurality of fifth semiconductor layers of the second conductivity type arranged in substantially equally spaced apart relation in the direction parallel to said first major surface.

9. The semiconductor device of claim 8, further comprising:
(k) a seventh semiconductor layer of the first conductivity type formed on said second major surface, the impurity concentration of said seventh semiconductor layer being higher than that of said first semiconductor layer; and
(l) an eighth semiconductor layer of the second conductivity type selectively formed in said seventh semiconductor layer.

* * * * *